(12) United States Patent
Inokuchi et al.

(10) Patent No.: US 10,211,394 B1
(45) Date of Patent: Feb. 19, 2019

(54) MAGNETIC MEMORY

(71) Applicant: KABUSHIKI KAISHA TOSHIBA, Minato-ku (JP)

(72) Inventors: Tomoaki Inokuchi, Yokohama (JP); Katsuhiko Koui, Yokohama (JP); Naoharu Shimomura, Meguro (JP); Yuuzo Kamiguchi, Yokohama (JP); Satoshi Shirotori, Yokohama (JP); Yuichi Ohsawa, Yokohama (JP); Hiroaki Yoda, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/911,227

(22) Filed: Mar. 5, 2018

(30) Foreign Application Priority Data

Sep. 20, 2017 (JP) ................................ 2017-180650

(51) Int. Cl.
*G11C 11/00* (2006.01)
*H01L 43/08* (2006.01)
(Continued)

(52) U.S. Cl.
CPC ............ *H01L 43/08* (2013.01); *G11C 11/161* (2013.01); *G11C 11/1675* (2013.01);
(Continued)

(58) Field of Classification Search
CPC .... G11C 11/161; G11C 11/1659; G11C 11/15
See application file for complete search history.

(56) References Cited

U.S. PATENT DOCUMENTS 7,238,540 B2  7/2007  Honjo et al.
8,897,061 B2  11/2014  Ezaki
(Continued)

FOREIGN PATENT DOCUMENTS

JP   2005-19457       1/2005
JP   2010-245415 A   10/2010
(Continued)

OTHER PUBLICATIONS

2015 Symposium on VLSI Technology Digest of Technical Papers, 2 pages.
H. Yoda et al., IEDM Tech. Dig. 2012 pp. 259-262, 4 pages.

*Primary Examiner* — Tuan T Nguyen
(74) *Attorney, Agent, or Firm* — Oblon, McClelland, Maier & Neustadt, L.L.P.

(57) ABSTRACT

A magnetic memory according to an embodiment includes: a first and second terminals; a conductive layer, which is nonmagnetic, the conductive layer including a first to third regions, the second region being disposed between the first region and the third region, the first region being electrically connected to the first terminal, and the third region being electrically connected to the second terminal; a magnetoresistive element disposed to correspond to the second region of the conductive layer, the magnetoresistive element including a first magnetic layer, a second magnetic layer disposed between the second region and the first magnetic layer and electrically connected to the second region, a nonmagnetic layer disposed between the first magnetic layer and the second magnetic layer, and a third terminal electrically connected to the first magnetic layer; and a third magnetic layer, the conductive layer being disposed between the third and second magnetic layers.

13 Claims, 10 Drawing Sheets

(51) Int. Cl.
*H01L 43/02* (2006.01)
*G11C 11/16* (2006.01)
*H01L 43/10* (2006.01)

(52) U.S. Cl.
CPC .......... *H01L 43/02* (2013.01); *G11C 11/1673* (2013.01); *H01L 43/10* (2013.01)

(56) References Cited

U.S. PATENT DOCUMENTS

| | | | |
|---|---|---|---|
| 9,076,537 B2 | 7/2015 | Khvalkovskiy et al. | |
| 9,129,692 B1 * | 9/2015 | Shukh | G11C 11/16 |
| 9,831,423 B2 * | 11/2017 | Kondo | G11C 11/1659 |
| 9,941,468 B2 | 4/2018 | Fukami et al. | |
| 10,068,946 B2 * | 9/2018 | Shimomura | G11C 11/161 |
| 2015/0041934 A1 | 2/2015 | Khvalkovskiy et al. | |
| 2016/0247550 A1 | 8/2016 | Fukami et al. | |
| 2016/0276006 A1 | 9/2016 | Ralph et al. | |
| 2017/0076769 A1 * | 3/2017 | Shirotori | G11C 11/161 |
| 2017/0125078 A1 | 5/2017 | Mihajlovic et al. | |
| 2017/0169872 A1 | 6/2017 | Yoda et al. | |
| 2018/0040812 A1 | 2/2018 | Shimizu et al. | |
| 2018/0268888 A1 * | 9/2018 | Ohsawa | G11C 11/165 |
| 2018/0277185 A1 * | 9/2018 | Shimizu | G11C 11/165 |
| 2018/0277746 A1 * | 9/2018 | Abe | G11C 11/161 |

FOREIGN PATENT DOCUMENTS

| | | |
|---|---|---|
| JP | 2013-243336 | 12/2013 |
| JP | 2014-45196 | 3/2014 |
| JP | 2017-59594 | 3/2017 |
| JP | 2017-112351 | 6/2017 |
| JP | 2018-22805 | 2/2018 |
| JP | 2018-88507 A | 6/2018 |
| WO | WO 2015/068509 A1 | 5/2015 |
| WO | WO 2016/021468 A1 | 2/2016 |

* cited by examiner

MAGNETIC MEMORY

CROSS REFERENCE TO RELATED APPLICATIONS

This application is based upon and claims the benefit of priority from the prior Japanese Patent Application No. 2017-180650, filed on Sep. 20, 2017, the entire contents of which are incorporated herein by reference.

FIELD

Embodiments described herein relate generally to magnetic memories.

BACKGROUND

Existing memories may be classified into volatile memories and nonvolatile storage memories. Examples of volatile memories include static random access memories (SRAMs) and dynamic random access memories (DRAMs), and examples of nonvolatile storage memories include NAND flash memories and hard disk drives (HDDs).

The volatile memories consume large energy due to leakage in the SRAMs, and refresh current in the DRAMs. In order to solve this problem, various nonvolatile working memories that may possibly replace the SRAMs and the DRAMs have been studied.

The working memories, however, are accessed more often in an active state than in a standby state. Since a large writing charge (Qw) is required in the active state, energy required for a write operation increases. As a result, the energy saved during the standby state due to their nonvolatile characteristic is completely consumed in the active state, and therefore the total energy consumption is difficult to be decreased. This is called "nonvolatile memories' historical dilemma." No existing product has solved this problem.

Recently performed experimental simulation using best data in laboratories may be solving the problem to reduce energy consumption if a STT (Spin Transfer Torque)-MRAM (Magnetic Random Access Memory) is used as a lowest level cache memory (LLC (Last Level Cache)), which is relatively not frequently used.

If the STT-MRAM is used as a cache memory that is higher in level than the LLC, the frequency at which it is accessed considerably increases. Therefore, considerable energy is consumed. The aforementioned energy consumption problem thus may not be solved.

DETAILED DESCRIPTION

Embodiments will now be described with reference to the accompanying drawings.

A magnetic memory according to an embodiment includes: a first terminal and a second terminal; a conductive layer, which is nonmagnetic, the conductive layer including a first region, a second region, and a third region, the second region being disposed between the first region and the third region, the first region being electrically connected to the first terminal, and the third region being electrically connected to the second terminal; a magnetoresistive element disposed to correspond to the second region of the conductive layer, the magnetoresistive element including a first magnetic layer, a second magnetic layer disposed between the second region and the first magnetic layer and electrically connected to the second region, a nonmagnetic layer disposed between the first magnetic layer and the second magnetic layer, and a third terminal electrically connected to the first magnetic layer; and a third magnetic layer, the conductive layer being disposed between the third magnetic layer and the second magnetic layer.

(First Embodiment)

Figure 1:
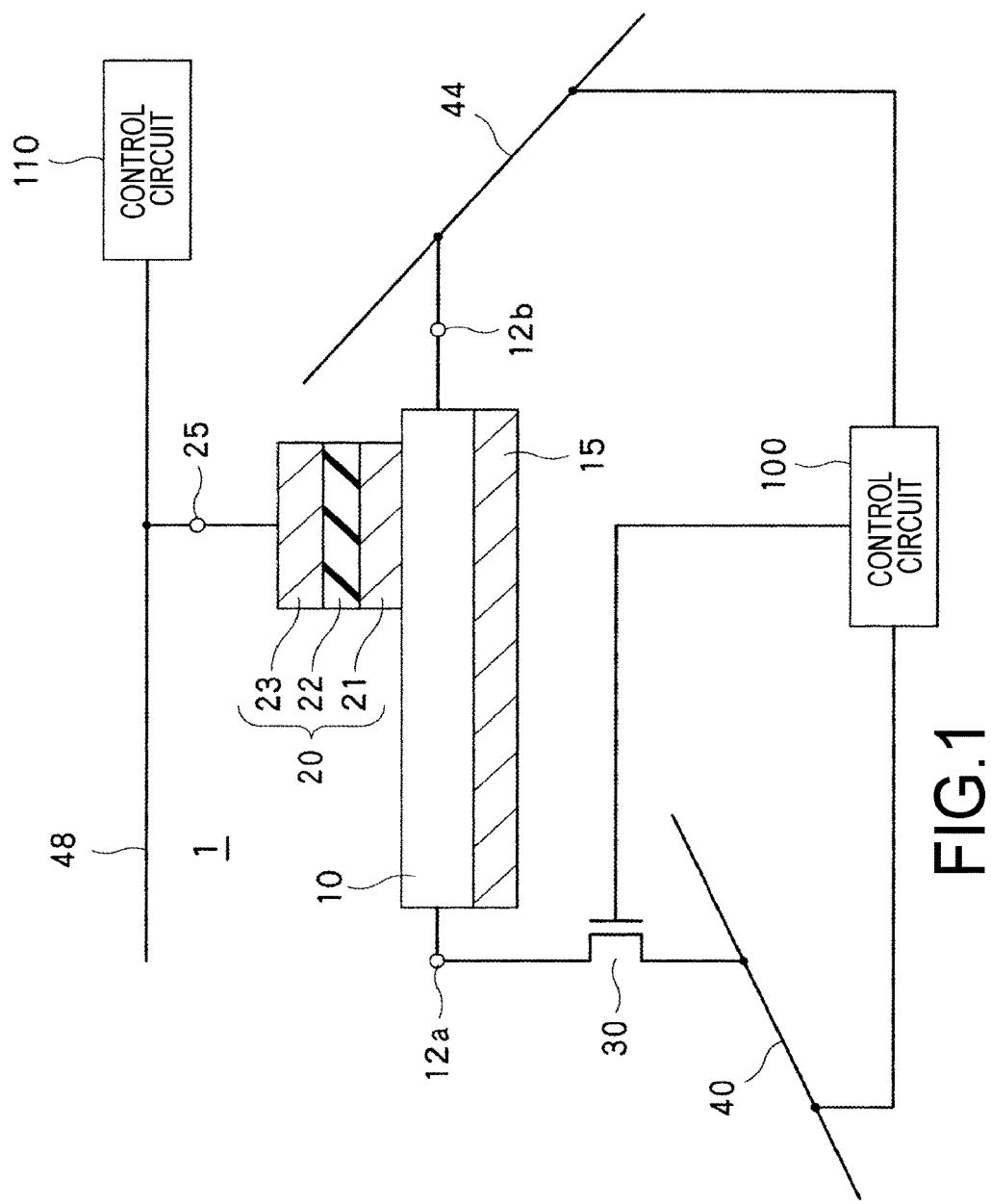
FIG. 1 is a cross-sectional view of a memory cell included in a magnetic memory according to a first embodiment.

A magnetic memory according to a first embodiment will be described with reference to FIGS. 1 to 3. The magnetic memory according to the first embodiment includes at least one memory cell. FIG. 1 is a cross-sectional view of the memory cell. The memory cell 1 includes a nonmagnetic conductive layer 10 (hereinafter also referred to as "SO layer 10"), a magnetoresistive element 20, and a magnetic layer 15.

A terminal 12a and a terminal 12b are electrically connected to the conductive layer 10. The magnetoresistive element 20 is electrically connected to a region of the conductive layer 10 between the terminal 12a and the terminal 12b. The state "A is electrically connected to B" means that A may be connected to B directly or via a conductive member.

The magnetoresistive element 20 includes a storage layer 21, a nonmagnetic layer 22, a reference layer 23, and a terminal 25. The storage layer 21 is a magnetic layer in which the magnetization direction may be changed, and the reference layer 23 is a magnetic layer in which the magnetization direction may not be changed. The state that "magnetization direction may be changed" means that, after a write operation is performed on the magnetoresistance device, the magnetization direction may be changed. The state that "magnetization direction may not be changed" means that, after a write operation is performed on the magnetoresistance device, the magnetization direction is not changed. The reference layer (first magnetic layer) 23 is disposed above the above-described region of the conductive layer 10, and the storage layer (second magnetic layer) 21 is disposed between the reference layer 23 and the region of the conductive layer 10. The nonmagnetic layer (first nonmagnetic layer) 22 is disposed between the reference layer 23 and the storage layer 21. The terminal 25 is electrically connected to the reference layer 23. If the nonmagnetic layer 22 is an insulating layer, the magnetoresistive element is a magnetic tunnel junction (MTJ) element, and if it is a nonmagnetic metal layer, the magnetoresistive element is a giant magneto-resistive (GMR) element.

The magnetic layer 15 is joined to a surface of the conductive layer 10 opposite to a surface where the magnetoresistive element 20 is disposed. Thus, the conductive layer 10 is disposed between the magnetoresistive element 20 and the magnetic layer 15.

The terminal 12a is electrically connected to a wiring line 40 via a selection transistor 30, the terminal 12b is electrically connected to a wiring line 44, and a terminal 25 is electrically connected to a wiring line 48.

The magnetic memory according to the first embodiment further includes a control circuit 100 and a control circuit 110. The control circuit 100 is electrically connected to the wiring line 40, the wiring line 44, and the gate of the transistor 30. The control circuit 110 is electrically connected to the wiring line 48. The control circuit 110 and the control circuit 110 may be combined to each other to be a single control circuit. The magnetic memory according to the first embodiment may further include a selecting transistor between the terminal 12b and the wiring line 44, and a selecting transistor between the terminal 25 and the wiring line 48.

The conductive layer 10 preferably includes a material that may be able to control the magnetization direction of the storage layer 21 included in the magnetoresistive element 20 due to the spin orbit torque or the Rashba effect. Examples of the preferable material of the conductive layer 10 include such metals as copper, rhodium, palladium, silver, hafnium, tantalum, tungsten, rhenium, osmium, iridium, platinum, gold, and bismuth, or oxides or nitrides of such metals. However, the material is not limited to the above materials.

Examples of the material of the magnetic layer 15 include metals containing at least one of Co, Fe, or Ni, and alloys of these metals such as Co—Pt, Co—Fe—Pt, Fe—Pt, Co—Fe—Cr—Pt, Co—Cr—Pt, Co—Pd, NiMnSb, $Co_2MnGe$, $Co_2MnAl$, $Co_2MnSi$, or CoCrFeAl. A Heusler alloy such as $Co_2FeAl_{1-x}Si_x$, or $Co_2Mn_{1-x}Fe_xSi$ may also be used. The magnetic layer 15 formed of one of the above materials is a magnetic metal layer.

The magnetic layer 15 may also be formed of a magnetic semiconductor such as GeMn, SiCNi, SiCMn, SiCFe, ZnMnTe, ZnCrTe, BeMnTe, ZnVO, ZnMnO, ZnCoO, GaMnAs, InMnAs, InMnAb, GaMnP, GaMnN, GaCrN, AlCrN, BiFeTe, SbVTe, PbSnMnTe, GeMnTe, CdMnGeP, ZnSiNMn, ZnGeSiNMn, BeTiFeO, CdMnTe, ZnMnS, TiCoO, SiMn, or SiGeMn.

A nonmagnetic element such as silver (Ag), copper (Cu), gold (Au), aluminum (Al), ruthenium (Ru), osmium (Os), rhenium (Re), tantalum (Ta), boron (B), carbon (C), oxygen (O), nitrogen (N), palladium (Pd), platinum (Pt), zirconium (Zr), iridium (Ir), tungsten (W), molybdenum (Mo), or niobium (Nb) may be added to the magnetic layer 15 to adjust the magnetic characteristics and other physical characteristics such as the crystallinity, the mechanical characteristics, and the chemical characteristics.

(Write Operation)

A write operation to write data to the memory cell according to the first embodiment will be described below. First, the control circuit 100 sends a signal to the gate of the selection transistor 30 to turn on the selection transistor 30. Subsequently, the control circuit 100 causes a write current Iw to flow from the wiring line 40 to the selection transistor 30, the terminal 12a, the conductive layer 10, the terminal 12b, and the wiring line 44. Due to the write current Iw, spin-orbit torque ("SOT") acts on the storage layer 21 of the magnetoresistive element 20 to switch the magnetization direction of the storage layer 21. The magnetization direction of the storage layer 21 may also be switched by turning on the selection transistor 30, and causing the write current Iw to flow from the wiring line 44 to the terminal 12b, the conductive layer 10, the terminal 12a, the selection transistor 30, and the wiring line 40 so that the SOT acts on the storage layer 21. In this case, the direction of the write current Iw is opposite to the former case, and the magnetization direction of the storage layer 21 is switched to a direction opposite to the direction of the former case.

If a voltage is applied to the wiring line 48 by the control circuit 110 during the write operation, the voltage is applied to the reference layer 23 via the terminal 25, and the magnetic characteristics of the storage layer 21 (voltage effect) is changed. The write current Iw may be lowered in this manner. This will be explained with reference to FIG. 2.

Figure 2:
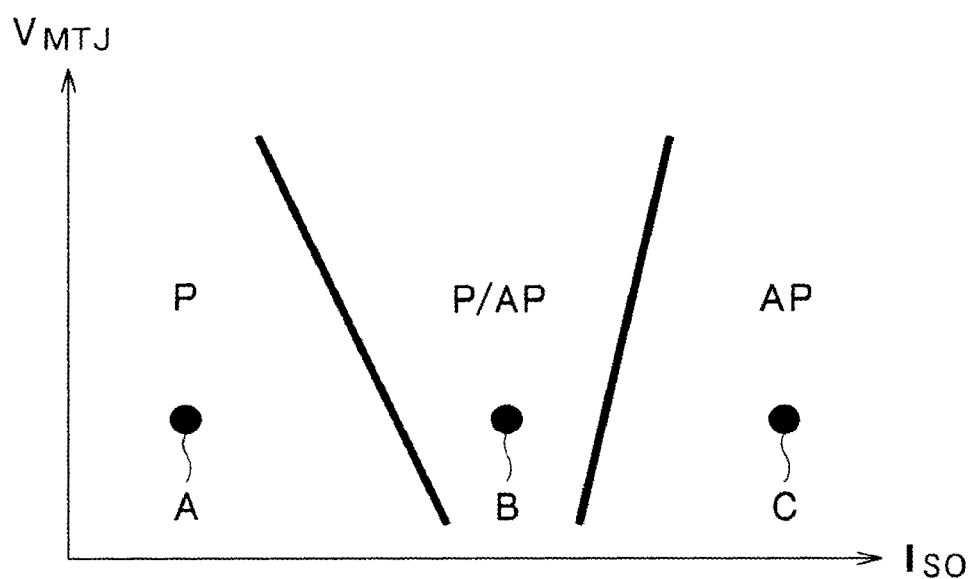
FIG. 2 is an explanatory diagram of a voltage effect in a write operation for the magnetic memory according to the first embodiment.
Figure 3:
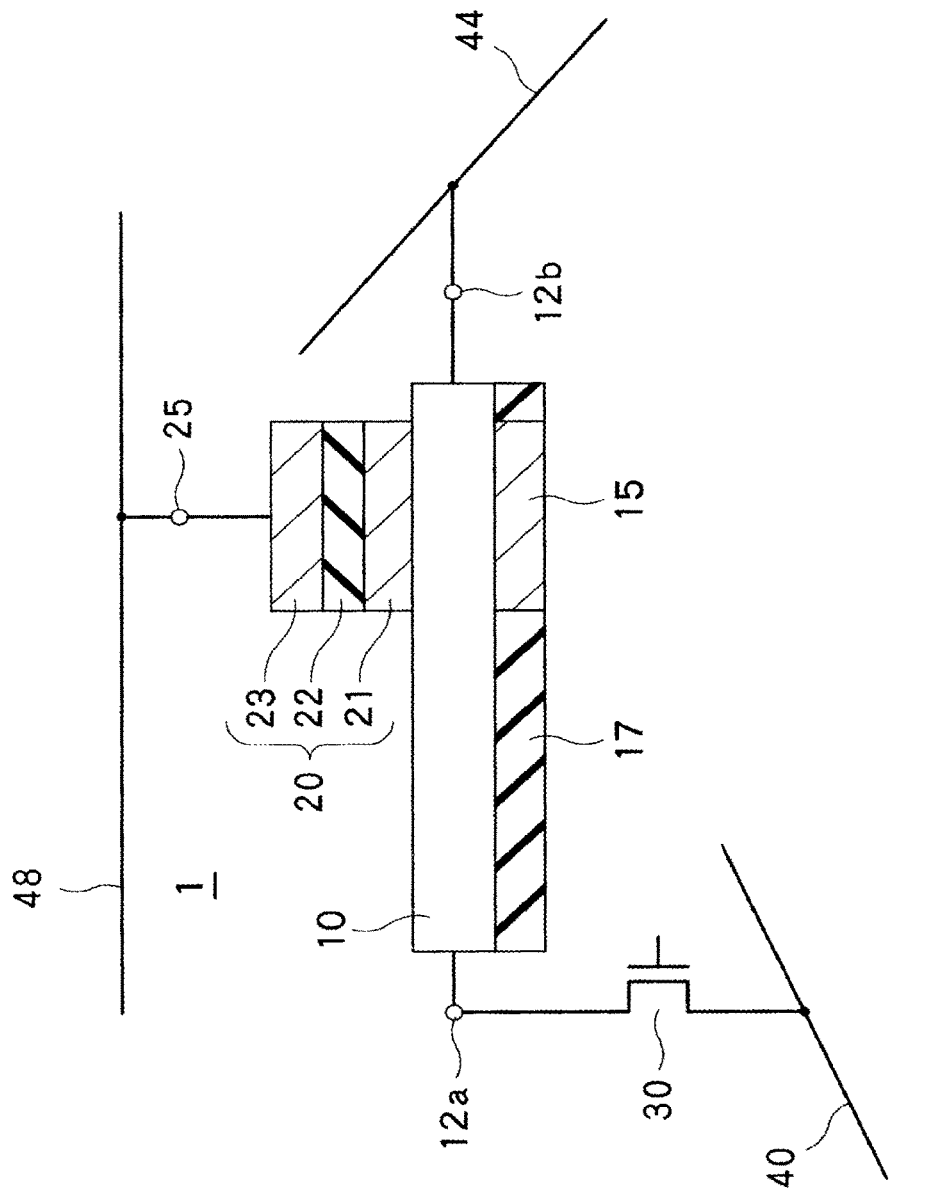
FIG. 3 is a cross-sectional view of a memory cell included in a magnetic memory according to a modification of the first embodiment.

FIG. 2 is an explanatory diagram for explaining that, when a voltage $V_{MTJ}$ applied to the reference layer 23 of the magnetoresistive element 20 is changed, the current $I_{SO}$ needed to switch the magnetization direction of the storage layer 21 is changed. In FIG. 2, the region P indicates that the magnetization direction of the storage layer 21 is parallel to the magnetization direction of the reference layer, the region AP indicates that they are antiparallel to each other, and the region P/AP indicates that both the parallel state and the antiparallel state can be found.

For example, if a voltage $V_{MTJ}$ corresponding to the point A is applied to the reference layer 23 of the magnetoresistive element 20, and a current $I_{SO}$ corresponding to the point A is caused to flow through the conductive layer 10, a write operation to lead to the parallel state (P state) may be performed. If a voltage $V_{MTJ}$ corresponding to the point C is applied to the reference layer 23 of the magnetoresistive element 20, and a current $I_{SO}$ corresponding to the point C is caused to flow through the conductive layer 10, a write operation to lead to the antiparallel state (AP state) may be performed.

If a write operation is performed by applying a control voltage to the reference layer 23 of the magnetoresistive element 20 and causing a write current to flow through the conductive layer 10, the control voltage is preferably cut off before the write current is interrupted. When the voltage $V_{MTJ}$ that correspond to the point A and the point C is applied, the magnetization direction of the storage layer 21 is likely to change, since the retention of the storage layer 21 is lowered. Therefore, if the voltage $V_{MTJ}$ is cut off after the write current is interrupted, the magnetization may be erroneously switched.

(Read Operation)

A read operation to read data from the magnetic memory according to the first embodiment is performed by causing a read current to flow between the terminal 25 and one of the terminal 12a and the terminal 12b using the control circuit 100 and the control circuit 110.

In conventional magnetic memories that perform a write operation using the SOT, the conductive layer is a single heavy metal layer, or has a multilayer structure including layers of nonmagnetic metals.

As shown in FIG. 1, the magnetic memory according to this embodiment has a structure in which the conductive layer 10 of a nonmagnetic metal is disposed on the magnetic layer 15, and the magnetoresistive element 20 is disposed on the conductive layer 10. The surface of the conductive layer 10 on which the magnetic layer 15 is disposed is opposite to the surface on which the magnetoresistive element 20 is disposed. The advantage of the multilayer structure including the nonmagnetic conductive layer 10 and the magnetic layer 15 is described below.

When a current flows through the conductive layer 10, spin-polarized electrons are accumulated near surfaces of the conductive layer 10. The storage layer 21 included in the magnetoresistive element 20, which is in contact with the conductive layer 10, receives the torque from the accumulated spin-polarized electrons, and as a result, the magnetization of the storage layer 21 is switched. Near a second surface of the conductive layer 10, which is opposed to a first surface that is in contact with of the storage layer 21, electrons that are spin-polarized in a direction opposite to the direction of the spin-polarized electrons near the first surface are accumulated. However, the spin-polarized electrons accumulated near the second surface have not been effectively used.

The magnetic layer 15 disposed on the second surface in this embodiment absorbs the spin-polarized electrons. This reduces the interaction between the spin-polarized electrons on the first surface side and the spin-polarized electrons on the second surface side. As a result, the spin polarization ratio on the first surface increases. This enables a write operation to be performed with a lower current. When the write operation is performed, the magnetic layer 15 also receives the SOT, which tilts the magnetization of the magnetic layer 15, and generates an assisting magnetic field for switching the magnetization of the storage layer 21. As a result, the write efficiency improves.

The magnetic layer 15 disposed on the conductive layer 10 in this embodiment may be a continuous layer or patterned. If the magnetic layer 15 is patterned, the magnetic layer 15 is preferably disposed to a location that is opposite side of the conductive layer 10 to the magnetoresistive element 20, as shown in FIG. 3. In FIG. 3, the reference numeral 17 denotes an insulating layer, and the control circuit 100 and the control circuit 110 in FIG. 1 are not shown.

In this embodiment, when no write current flows through the conductive layer 10, the magnetization direction of the magnetic layer 15 is opposite to the magnetization direction of the storage layer 21 included in the magnetoresistive element 20 disposed immediately above the magnetic layer 15.

As described above, according to the first embodiment, the energy consumption and the write current may be reduced by disposing the magnetoresistive element 20 on the conductive layer 10, disposing the magnetic layer 15 under the conductive layer 10 immediately below the magnetoresistive element 20, and performing a write operation using the SOT.

(Second Embodiment)

A magnetic memory according to a second embodiment will be described with reference to FIGS. 4A and 4B. The magnetic memory according to the second embodiment is configured so that the relationship between the magnetization of the storage layer 21 included in the magnetoresistive element 20 disposed on the first surface of the conductive layer 10 and the spin-polarized electrons near the Fermi level is the same as the relationship between the magnetization of the magnetic layer 15 disposed on the second surface and the spin-polarized electrons near the Fermi level in the magnetic memory according to the first embodiment.

Figure 4A:
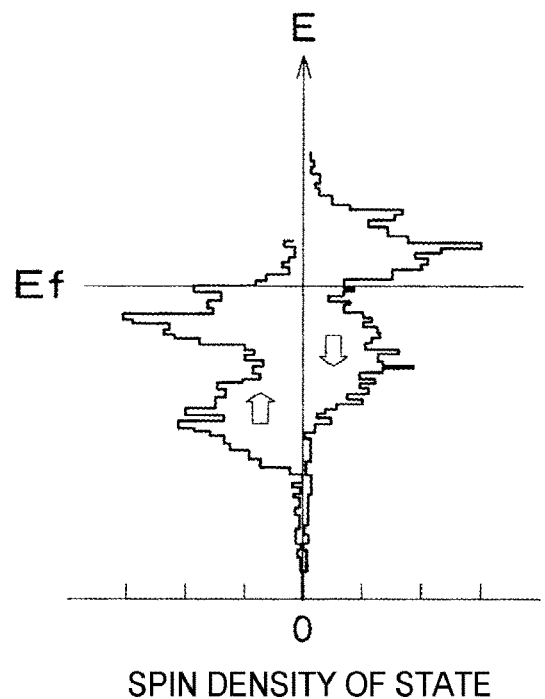
FIG. 4A is a diagram showing the dependency of spin density of state on energy.
Figure 4B:
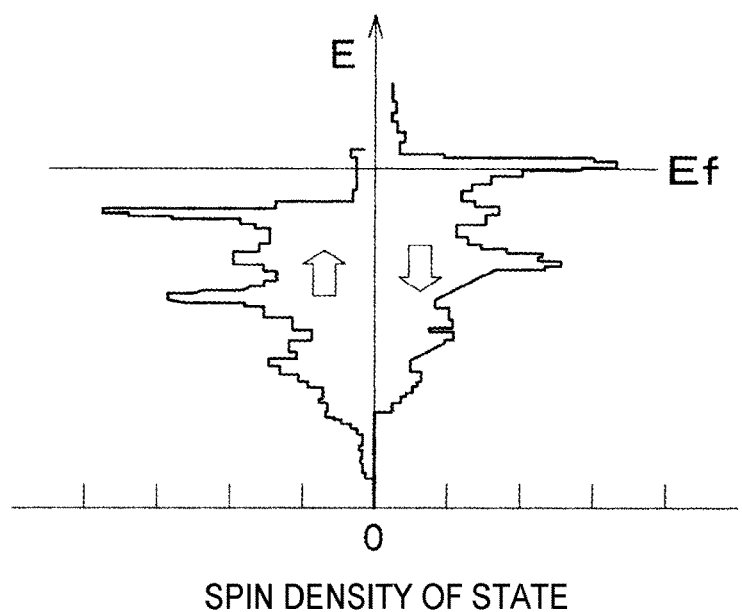
FIG. 4B is a diagram showing the dependency of spin density of state on energy.

FIG. 4A and FIG. 4B show the dependency of spin density of state on energy. In FIGS. 4A and 4B, the horizontal axis indicates the spin density of state (arbitrarily set unit), and the vertical axis indicates energy (arbitrarily set unit). For example, the material shown in FIG. 4A has up-spin in total, and also near the Fermi level $Ef$. The material shown in FIG. 4B has up-spin in total, but down-spin near the Fermi level $Ef$. The spin-polarized electrons generated by the current flowing through the conductive layer 10 have an influence on the magnetization of the storage layer 21 and electrons near the Fermi level in the magnetic layer 15 disposed on the second surface side.

As described in the descriptions of the first embodiment, the direction of spin of the spin-polarized electrons accumulated on the second surface side is opposite to the direction of spin of the spin-polarized electrons accumulated on the first surface side. Therefore, if the relationship between the magnetization of the storage layer 21 and the spin-polarized electrons near the Fermi level is the same as the relationship between the magnetization of the magnetic layer 15 disposed on the second surface side and the spin-polarized electrons near the Fermi level, or if the relationship between the direction of the magnetization in the storage layer 21 and the direction of spin of the spin-polarized electrons near the Fermi level is the same as the direction of magnetization in the magnetic layer 15 and the direction of spin of the spin-polarized electrons near the Fermi level, the storage layer 21 and the magnetic layer 15 receive torque from the spin-polarized electrons generated in the conductive layer 10 so that the magnetization directions of these layers are opposite to each other. The storage layer 21 and the magnetic layer 15 interact with each other by magnetostatic coupling, or exchange coupling in some cases. Therefore, when the magnetization of the magnetic layer 15 is switched, the magnetic lines generated by the magnetic layer 15 act to assist the switching of the magnetization of the storage layer 21. Thus, the magnetic memory according to this embodiment may switch the magnetization of the storage layer 21 with a lower write current than a magnetic memory in which the magnetic layer 15 is not disposed on the second surface side of the conductive layer 10.

The magnetic layer 15 disposed on the second surface side of the conductive layer 10 interacts with the storage layer 21 by magnetostatic coupling, or exchange coupling in some cases, even if no write current flows through the conductive layer 10. As a result, the magnetic lines are closed between the storage layer 21 and the magnetic layer 15. The magnetic lines closed between the storage layer 21 and the magnetic layer 15 reduces the ratio of leakage of the magnetic field generated by the storage layer 21 to adjacent bits (magnetoresistive elements), and thus the interference between the adjacent bits.

The conductive layer 10 according to the second embodiment is preferably formed of a material, with which the magnetization direction of the storage layer 21 included in the magnetoresistive element 20 may be controlled by the spin orbit torque or the Rashba effect. Examples of the material of the conductive layer 10 include metals such as copper, rhodium, palladium, silver, hafnium, tantalum, tungsten, rhenium, osmium, iridium, platinum, gold, and bismuth, and oxides and nitrides of the above-described metals. However, the material is not limited to the above-described materials.

The magnetic layer 15 is preferably formed of a metal containing at least one of Co, Fe, or Ni, or an alloy of the above metals, such as Co—Pt, Co—Fe—Pt, Fe—Pt, Co—

Fe—Cr—Pt, Co—Cr—Pt, Co—Pd, NiMnSb, Co$_2$MnGe, Co$_2$MnAl, Co$_2$MnSi, or CoCrFeAl. The magnetic layer 15 may also be formed of a Heusler alloy, such as Co$_2$FeAl$_{1-x}$Si$_x$ (1>x>0) or Co$_2$Mn$_{1-x}$Fe$_x$Si (1>x>0). The magnetic layer 15 formed of one of the above-described materials is a magnetic metal layer.

The magnetic layer 15 may also be formed of a magnetic semiconductor such as GeMn, SiCNi, SiCMn, SiCFe, ZnMnTe, ZnCrTe, BeMnTe, ZnVO, ZnMnO, ZnCoO, GaMnAs, InMnAs, InMnAb, GaMnP, GaMnN, GaCrN, AlCrN, BiFeTe, SbVTe, PbSnMnTe, GeMnTe, CdMnGeP, ZnSiNMn, ZnGeSiNMn, BeTiFeO, CdMnTe, ZnMnS, TiCoO, SiMn, or SiGeMn.

A nonmagnetic element such as silver (Ag), copper (Cu), gold (Au), aluminum (Al), ruthenium (Ru), osmium (Os), rhenium (Re), tantalum (Ta), boron (B), carbon (C), oxygen (O), nitrogen (N), palladium (Pd), platinum (Pt), zirconium (Zr), iridium (Ir), tungsten (W), molybdenum (Mo), or niobium (Nb) may be added to the magnetic layer 15 to adjust the magnetic characteristics and other physical characteristics such as the crystallinity, the mechanical characteristics, and the chemical characteristics.

The material of the magnetic layer 15 preferably has a relatively low conductivity. If the conductivity of the magnetic layer 15 is high, the write current flowing between the terminal 12a and the terminal 12b may branch into the magnetic layer 15 and reduce the current flowing through the conductive layer 10. This degrades the write efficiency. For this reason, the magnetic layer 15 preferably is formed of one of the above-described oxides and nitrides.

The second embodiment may reduce the energy consumption and the write current, like the first embodiment.

(Third Embodiment)

Figure 5:
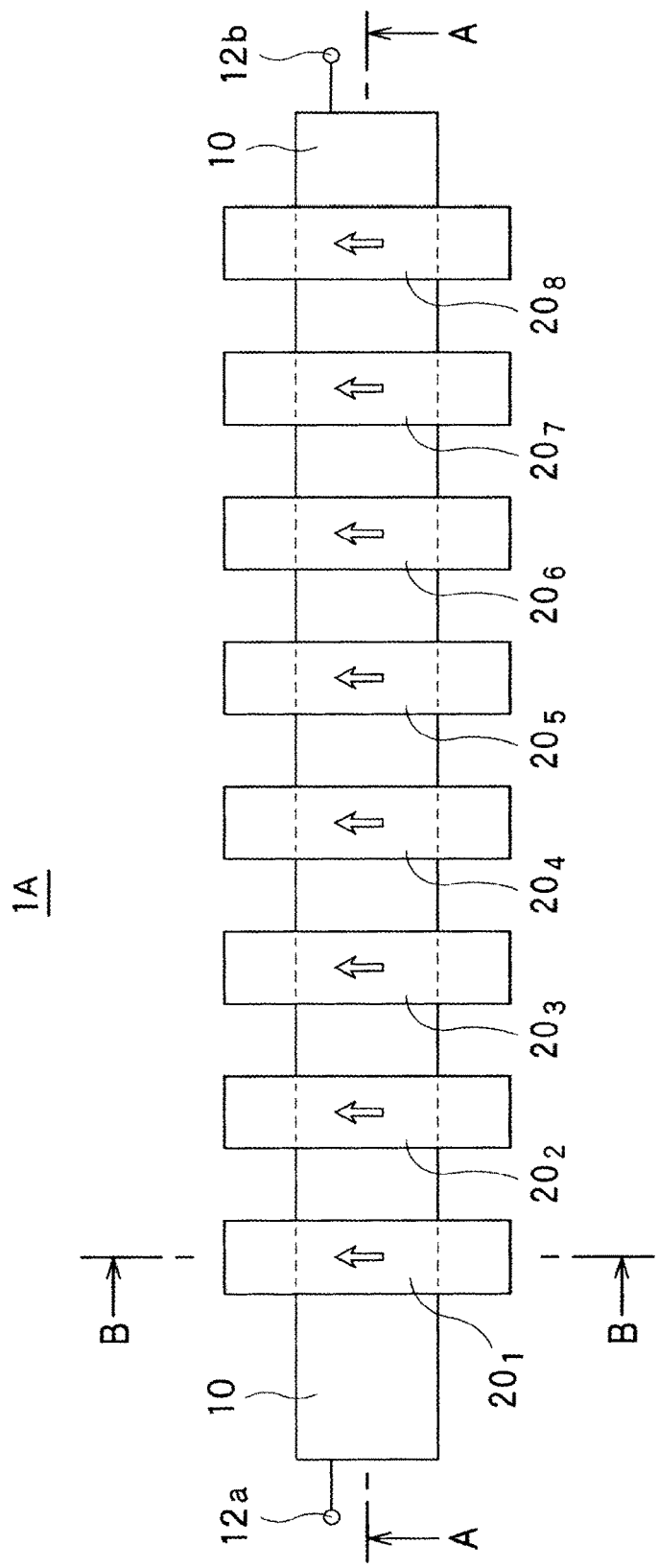
FIG. 5 is a plan view of a memory cell included in a magnetic memory according to a third embodiment.
Figure 6:
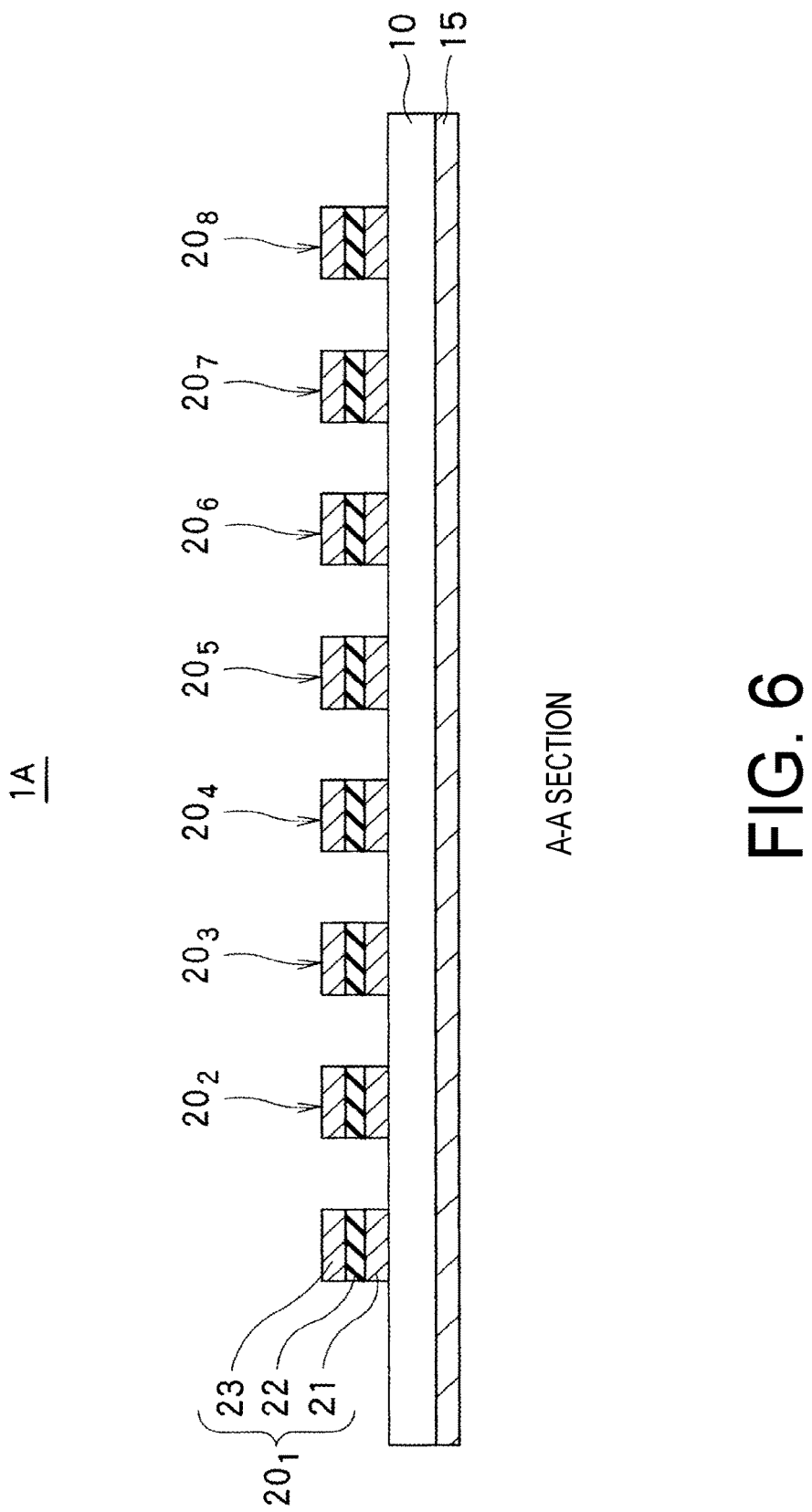
FIG. 6 is a cross-sectional view of the memory cell according to the third embodiment.
Figure 7:
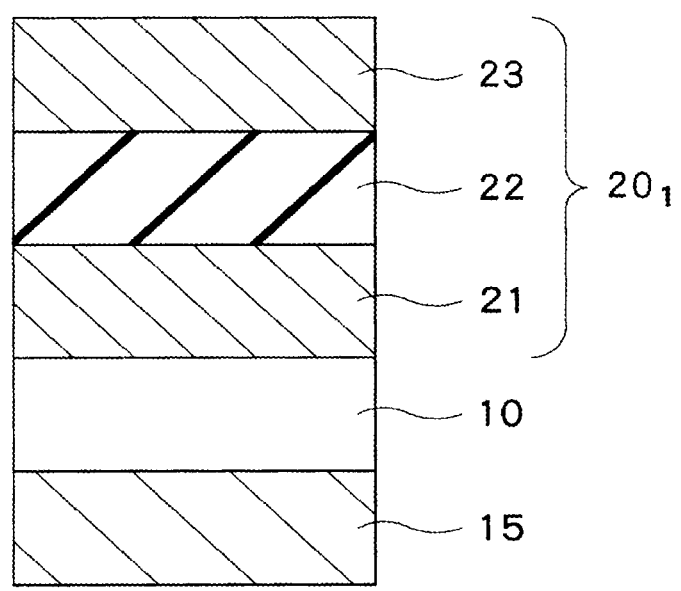
FIG. 7 is a cross-sectional view of the memory cell according to the third embodiment.

A magnetic memory according to a third embodiment will be described with reference to FIGS. 5 to 7. The magnetic memory according to the third embodiment includes at least one memory cell 1A, the top view of which is shown in FIG. 5. A cross-sectional view of the memory cell 1A taken along line A-A in FIG. 5 is shown in FIG. 6, and a cross-sectional view taken alone line B-B in FIG. 5 is shown in FIG. 7.

The memory cell 1A includes a conductive layer 10, a magnetic layer 15, and a plurality of, for example eight, memory elements 20$_1$ to 20$_8$ disposed on the conductive layer 10.

Each memory element 20$_i$ (i=1, ..., 8) is disposed on the conductive layer 10, and has the same structure as the magnetoresistive element 20 according to the first embodiment shown in FIG. 1. Each memory element 20$_i$ (i=1, ..., 8) thus includes a storage layer 21, a nonmagnetic layer 22 disposed on the storage layer 21, and a reference layer 23. The memory cell included in the magnetic memory according to the third embodiment may store 8-bit data.

As in the case of the first embodiment, a magnetic layer 15 is disposed on a surface of the conductive layer 10 opposite to a surface on which the memory element 20$_1$ to 20$_8$ are disposed.

As can be understood from FIG. 5 and FIG. 7, a region of the conductive layer 10 according to the third embodiment, in which each of the memory elements 20$_1$ to 20$_8$ are disposed, is longer in a direction that is perpendicular to a direction from the terminal 12a to the terminal 12b than the other regions, for example a region between adjacent memory elements and regions to which the terminals 12a and 12b are connected. Thus, the conductive layer 10 does not have a linear planar shape but has a planar shape with protrusions and recessions, as shown in FIGS. 5 and 7. The regions in which the memory elements 20$_1$ to 20$_8$ are disposed are protruded, and the other regions are recessed. Alternatively, the regions in which the memory elements 20$_1$ to 20$_8$ are disposed may be recessed, and the other regions may be protruded. As can be understood from FIG. 5 and FIG. 7, the magnetic layer 15 also have a protruded and recessed planar shape like the conductive layer 10.

Although the magnetic layer 15, the conductive layer 10, the storage layer 21, the nonmagnetic layer 22, and the reference layer 23 in FIG. 7 have the same cross-sectional area when sectioned in the stacking direction, the cross-sectional area may be decreased in the order of the magnetic layer 15, the conductive layer 10, the storage layer 21, the nonmagnetic layer 22, and the reference layer 23 to form a tapered shape.

In the magnetic memory according to the third embodiment having the above-described structure, the magnetic layer 15 is disposed on a second surface of the conductive layer 10 (that is opposite to a surface on which the magnetoresistive elements 20$_1$ to 20$_8$ are disposed), and regions of the magnetic layer 15 corresponding to the regions in which the memory elements 20$_1$ to 20$_8$ are disposed have a protruded or recessed shape. As a result, the magnetic field from the magnetic layer 15 disposed on the second surface of the conductive layer 10 may be effectively applied to the storage layers of the magnetoresistive element 20$_1$-20$_8$. Therefore, the write current may be reduced more than that in the first embodiment.

(First Modification)

Figure 8A:
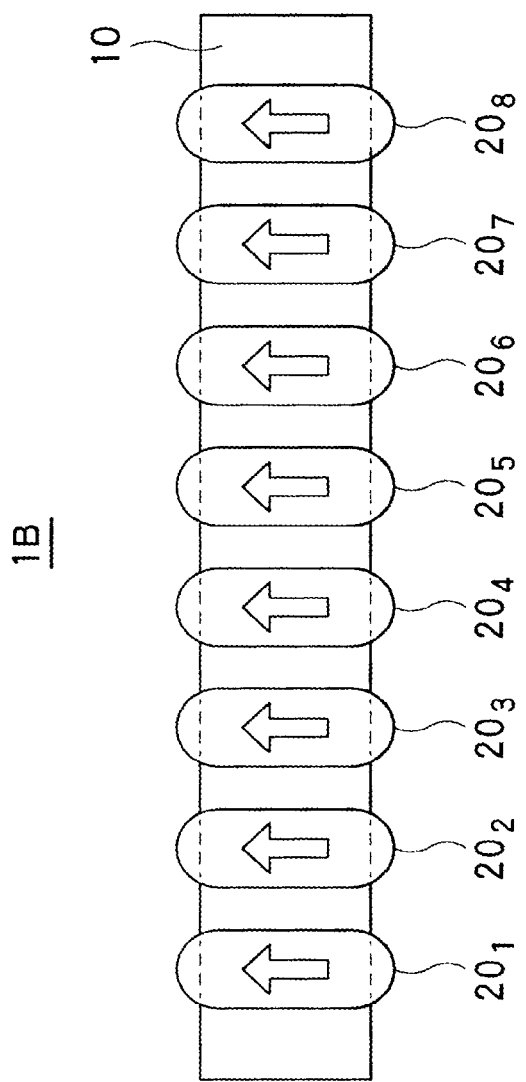
FIG. 8A is a plan view of a memory cell according to a first modification of the third embodiment.

A magnetic memory according to a first modification of the third embodiment is shown in FIG. 8A. The magnetic memory according to the first modification includes at least one memory cell. This memory cell 1B differs from the memory cell 1A included in the magnetic memory according to the third embodiment shown in FIG. 5 in the planar shape of the memory elements 20$_1$ to 20$_8$. Although the planar shape of each of the memory elements 20$_1$ to 20$_8$ according to the third embodiment shown in FIG. 5 is rectangular, the planar shape of each of the memory elements 20$_1$ to 20$_8$ according to the first modification shown in FIG. 8A is a racetrack shape. Thus, the planar shape of each of the memory elements 20$_1$ to 20$_8$ according to the first modification is obtained by rounding the corners of the rectangular shape of each of the memory elements 20$_1$ to 20$_8$ according to the third embodiment.

(Second Modification)

Figure 8B:
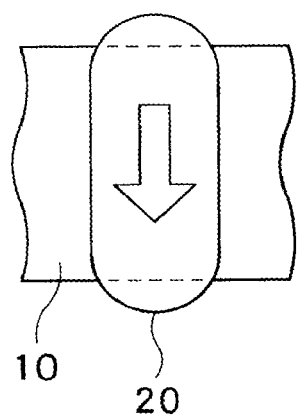
FIG. 8B is a plan view of a memory cell according to a second modification of the third embodiment.

A magnetic memory according to a second modification of the third embodiment is shown in FIG. 8B. The magnetic memory according to the second modification includes at least one memory cell. This memory cell 1C is obtained by replacing the memory elements 20$_1$ to 20$_8$ of the memory cell 1B included in the magnetic memory according to the first modification with a single memory element 20. Thus, the magnetic memory according to the second modification has a 1-bit memory cell structure.

The third embodiment and its modifications may reduce the energy consumption and the write current, like the first embodiment.

(Fourth Embodiment)

Figure 9:
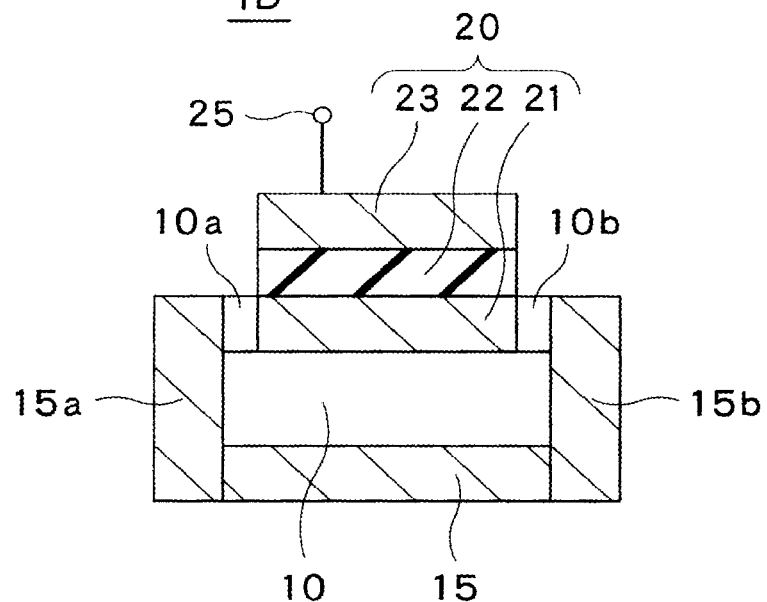
FIG. 9 is a cross-sectional view of a memory cell included in a magnetic memory according to a fourth embodiment.

A magnetic memory according to a fourth embodiment will be described with reference to FIG. 9. The magnetic memory according to the fourth embodiment has the same structure as the magnetic memory according to the third embodiment except for the cross-sectional view taken along line B-B of FIG. 5. FIG. 9 shows a cross-section of the memory cell according to the fourth embodiment taken in a direction crossing the direction along which the write current flows.

The memory cell 1D according to the fourth embodiment includes a conductive layer 10, a magnetoresistive element 20 disposed on the conductive layer 10, a magnetic layer 15 disposed under the conductive layer 10, magnetic layers 15a and 15b disposed on side surfaces of the conductive layer 10, side surface of the magnetic layer 15, and side surfaces of the magnetoresistive element 20 and containing the same material as the magnetic layer 15, and nonmagnetic layers 10a and 10b disposed between the side surfaces of the magnetoresistive element 20 and the magnetic layers 15a and 15b and containing the same material as the conductive layer 10.

The magnetoresistive element 20 includes a storage layer 21 disposed on the conductive layer 10, a nonmagnetic layer 22 disposed on the storage layer 21, and a reference layer 23 disposed on the nonmagnetic layer 22, like the magnetoresistive elements 20 according to the first to third embodiments. Top surfaces of the magnetic layers 15a and 15b are preferably positioned to be lower than the interface between the storage layer 21 and the nonmagnetic layer 22.

The write operation and the read operation of the fourth embodiment are performed in the same manner as those of the first embodiment. The control circuit 100 and the control circuit 110 described in the descriptions of the first embodiment are not shown in FIG. 9.

The magnetic memory according to the fourth embodiment including the memory cell 1D having the above-described structure is capable of effectively applying a magnetic field from the magnetic layer 15 to the storage layer 21, and thus effectively assisting the switching of the magnetization of the storage layer 21.

As described above, the fourth embodiment may reduce the energy consumption and the write current, like the third embodiment.

(Fifth Embodiment)

Figure 10:
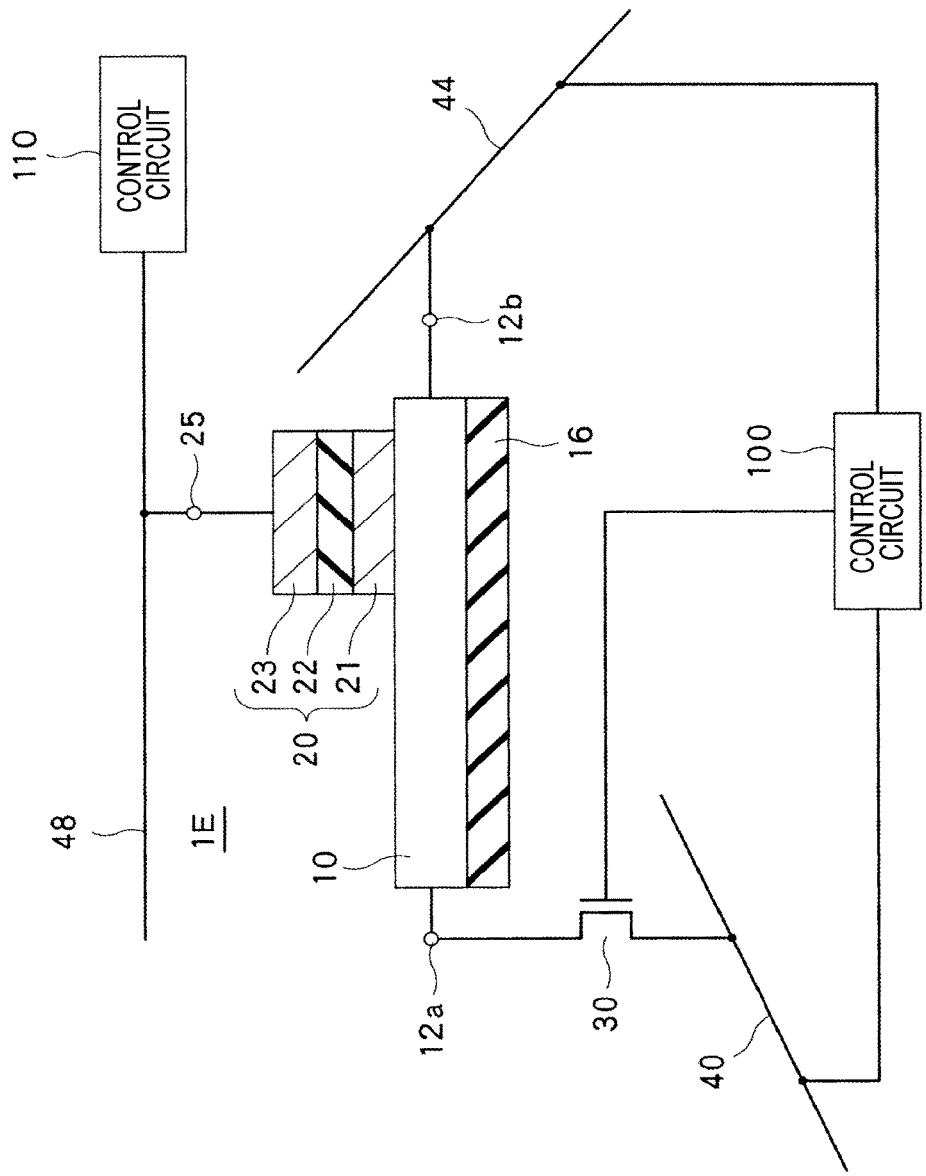
FIG. 10 is a cross-sectional view of a memory cell included in a magnetic memory according to a fifth embodiment.

A magnetic memory according to a fifth embodiment will be described with reference to FIG. 10. The magnetic memory according to the fifth embodiment is obtained by replacing the magnetic layer 15 with a layer of a material having a lower conductivity than the material used in the magnetic layer 15 included in any of the magnetic memories according to the first to fourth embodiments. FIG. 10 is a cross-sectional view of a memory cell included in the magnetic memory according to the fifth embodiment. The memory cell 1E shown in FIG. 10 is obtained by replacing the magnetic layer 15 included in the memory cell 1 shown in FIG. 1 with a magnetic layer 16 of a material having a lower conductivity.

The use of the magnetic layer 16 disposed on the second surface side of the conductive layer 10 may prevent the write current flowing through the conductive layer 10 from branching into a ferromagnetic material, and as a result enable a write operation to be performed with a lower current.

The magnetic layer 16 may be formed of one of the following materials. The magnetic layer 16 may be formed an oxide or nitride of at least one metal selected from Co, Fe, and Ni, or an oxide or nitride of an alloy containing the above metal, for example an oxide or nitride of Co—Pt, Co—Fe—Pt, Fe—Pt, Co—Fe—Cr—Pt, Co—Cr—Pt, Co—Pd, NiMnSb, Co$_2$MnGe, Co$_2$MnAl, Co$_2$MnSi, or CoCrFeAl. An oxide or a nitride of a Heusler alloy, for example an oxide or a nitride of Co$_2$FeAl$_{1-x}$Si$_x$ (0<x<1) or Co$_2$Mn$_{1-x}$Fe$_x$Si (0<x<1) may also be used. The magnetic layer 16 formed of one of the above-described materials is a magnetic insulating layer.

The magnetic layer 16 may also be formed of a magnetic semiconductor such as GeMn, SiCNi, SiCMn, SiCFe, ZnMnTe, ZnCrTe, BeMnTe, ZnVO, ZnMnO, ZnCoO, GaMnAs, InMnAs, InMnAb, GaMnP, GaMnN, GaCrN, AlCrN, BiFeTe, SbVTe, PbSnMnTe, GeMnTe, CdMnGeP, ZnSiNMn, ZnGeSiNMn, BeTiFeO, CdMnTe, ZnMnS, TiCoO, SiMn, or SiGeMn.

A nonmagnetic element such as silver (Ag), copper (Cu), gold (Au), aluminum (Al), ruthenium (Ru), osmium (Os), rhenium (Re), tantalum (Ta), boron (B), carbon (C), oxygen (O), nitrogen (N), palladium (Pd), platinum (Pt), zirconium (Zr), iridium (Ir), tungsten (W), molybdenum (Mo), or niobium (Nb) may be added to the magnetic layer 16 to adjust the magnetic characteristics and other physical characteristics such as the crystallinity, the mechanical characteristics, and the chemical characteristics.

As describe above, the fifth embodiment may reduce the energy consumption and the write current, like the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a first terminal and a second terminal;
a conductive layer, which is nonmagnetic, the conductive layer including a first region, a second region, and a third region, the second region being disposed between the first region and the third region, the first region being electrically connected to the first terminal, and the third region being electrically connected to the second terminal;
a magnetoresistive element disposed to correspond to the second region of the conductive layer, the magnetoresistive element including a first magnetic layer, a second magnetic layer disposed between the second region and the first magnetic layer and electrically connected to the second region, a nonmagnetic layer disposed between the first magnetic layer and the second magnetic layer, and a third terminal electrically connected to the first magnetic layer; and
a third magnetic layer, the conductive layer being disposed between the third magnetic layer and the second magnetic layer.

2. The magnetic memory according to claim 1, further comprising a fourth magnetic layer, wherein the conductive layer includes a first surface, on which the second magnetic layer is disposed, a second surface, which is opposed to the first surface and on which the third magnetic layer is disposed, and a third surface that is different from the first surface and the second surface, and the fourth magnetic layer is disposed on the third surface.

3. The magnetic memory according to claim 1, further comprising a circuit configured to flow a write current between the first terminal and the second terminal via the conductive layer and apply a control voltage to the third terminal.

4. The magnetic memory according to claim 3, wherein the circuit cuts off the control voltage before interrupting the write current.

5. The magnetic memory according to claim 3, wherein when no write current flows between the first terminal and the second terminal, a magnetization direction of the third magnetic layer and a magnetization direction of the second magnetic layer are opposite to each other.

6. The magnetic memory according to claim 1, wherein the third magnetic layer is in contact with a face that is opposite side of the conductive layer to the second magnetic layer.

7. A magnetic memory comprising:
a first terminal and a second terminal;
a conductive layer, which is nonmagnetic, the conductive layer including a first region, a second region, and a third region, the second region being disposed between the first region and the third region, the first region being electrically connected to the first terminal, and the third region being electrically connected to the second terminal;
a magnetoresistive element disposed to correspond to the second region, the magnetoresistive element including a first magnetic layer that is disposed to be separate from the second region in a first direction that intersects a second direction that is from the first region to the third region, a second magnetic layer disposed between the second region and the first magnetic layer and electrically connected to the second region, a nonmagnetic layer disposed between the first magnetic layer and the second magnetic layer, and a third terminal electrically connected to the first magnetic layer; and
a third magnetic layer including a fourth region, the second region being disposed between the fourth region and the second magnetic layer, and a length of the fourth region in a third direction that intersects a plane including the first direction and the second direction being greater than a length of at least one of the first region and the third region in the third direction.

8. The magnetic memory according to claim 7, wherein a length of the second region in the third direction of the conductive layer is greater than the length of at least one of the first region and the third region in the third direction.

9. The magnetic memory according to claim 7, further comprising a fourth magnetic layer, wherein the conductive layer includes a first surface, on which the second magnetic layer is disposed, a second surface, which is opposed to the first surface and on which the third magnetic layer is disposed, and a third surface that is different from the first surface and the second surface, and the fourth magnetic layer is disposed on the third surface.

10. The magnetic memory according to claim 7, further comprising a circuit configured to flow a write current between the first terminal and the second terminal via the conductive layer and apply a control voltage to the third terminal.

11. The magnetic memory according to claim 10, wherein the circuit cuts off the control voltage before interrupting the write current.

12. The magnetic memory according to claim 10, wherein when no write current flows between the first terminal and the second terminal, a magnetization direction of the third magnetic layer and a magnetization direction of the second magnetic layer are opposite to each other.

13. The magnetic memory according to claim 7, wherein the third magnetic layer is in contact with a face that is opposite side of the conductive layer to the second magnetic layer.

* * * * *